United States Patent
Liu et al.

(10) Patent No.: US 12,310,223 B1
(45) Date of Patent: May 20, 2025

(54) METHOD FOR PREPARING PEROVSKITE SOLAR CELL BY IN-SITU INJECTION OF SELF-ASSEMBLED MOLECULE

(71) Applicant: Tianjin University, Tianjin (CN)

(72) Inventors: Hongli Liu, Tianjin (CN); Huayu Bao, Tianjin (CN); Shirong Wang, Tianjin (CN); Xianggao Li, Tianjin (CN)

(73) Assignee: Tianjin University, Tianjin (CN)

( * ) Notice: Subject to any disclaimer, the term of this patent is extended or adjusted under 35 U.S.C. 154(b) by 0 days.

(21) Appl. No.: 19/001,454

(22) Filed: Dec. 25, 2024

(30) Foreign Application Priority Data

Jan. 5, 2024 (CN) .......................... 202410018187.1

(51) Int. Cl.
*H10K 71/15* (2023.01)
*H10K 71/40* (2023.01)
*H10K 71/60* (2023.01)
*H10K 85/50* (2023.01)
*H10K 30/50* (2023.01)

(52) U.S. Cl.
CPC ............. *H10K 71/15* (2023.02); *H10K 71/40* (2023.02); *H10K 71/60* (2023.02); *H10K 85/50* (2023.02); *H10K 30/50* (2023.02)

(58) Field of Classification Search
None
See application file for complete search history.

(56) References Cited

FOREIGN PATENT DOCUMENTS

| CN | 108365100 A | 8/2018 |
|---|---|---|
| CN | 109545970 A | 3/2019 |

*Primary Examiner* — Anthony Ho
(74) *Attorney, Agent, or Firm* — Bayramoglu Law Offices LLC

(57) ABSTRACT

A method for preparing a perovskite solar cell by in-situ injection of the self-assembled molecules includes preparing the substrate; preparing the perovskite precursor solution; preparing the anti-solvent containing self-assembled conjugated small molecule materials; dripping the perovskite precursor solution and the anti-solvent containing the self-assembled conjugated small molecule materials successively on the substrate to prepare the perovskite layer; annealing the perovskite layer; preparing the precursor solution of the hole transport layer; spin-coating the precursor solution of the hole transport layer on the surface of the perovskite layer to prepare the hole transport layer; preparing the metal electrode for the hole transport layer. The invention effectively passivates the defects on the surface and grain boundary of perovskite by in-situ anti-solvent injection of self-assembled conjugated molecules, inhibits non-radiative recombination, and assists the growth of perovskite into larger and more uniform grains.

5 Claims, 4 Drawing Sheets

METHOD FOR PREPARING PEROVSKITE SOLAR CELL BY IN-SITU INJECTION OF SELF-ASSEMBLED MOLECULE

CROSS REFERENCE TO THE RELATED APPLICATIONS

This application is based upon and claims priority to Chinese Patent Application No. 202410018187.1, filed on Jan. 5, 2024, the entire contents of which are incorporated herein by reference.

TECHNICAL FIELD

The invention belongs to the field of photovoltaic device technology, particularly a method for preparing a perovskite solar cell by in-situ injection of self-assembled molecules.

BACKGROUND

The device structure of perovskite solar cells (PSCs) mainly includes photoanode, electron transport layer, perovskite light-absorbing layer, hole transport layer, and metal cathode. Among them, the perovskite light-absorbing layer is the key photogenerated carrier-forming layer. Perovskite materials have attracted much attention due to their high light absorption coefficient, long carrier life, and simple preparation process. Compared with traditional silicon-based solar cells, perovskite solar cells have become the most promising photovoltaic technology in the new generation due to their advantages in photoelectric conversion efficiency, preparation cost, and processing technology.

The preparation of the perovskite layer is the most critical part of the preparation process for PSCs, as it directly affects the photoelectric conversion efficiency of the whole device. At present, the commonly used method for preparing perovskite layer is one-step anti-solvent method, that is, by spin-coating poor solvents (such as chlorobenzene, toluene, ethyl acetate, ether, etc.) on the substrate containing perovskite precursor, it plays a role in removing perovskite precursor solvents (such as N,N'-dimethylformamide, dimethyl sulfoxide, etc.) and promoting the crystallization of perovskite films. At present, the photoelectric conversion efficiency of single-junction PSCs has exceeded 26%, and its poor stability under light, high temperature, and high humidity conditions has seriously affected its commercial application. The traditional perovskite layer film usually produces more defects in the one-step anti-solvent preparation process, and the grain size is difficult to control. At the same time, the surface is very prone to the aggregation of metal halide components, which is not conducive to the transmission and extraction of photogenerated carriers. In order to solve these problems, the commonly used method is to prepare an isopropanol solution mainly composed of an alkyl ammonium salt and aromatic ammonium salt as interface modifier to spin coating on the surface of the perovskite layer, and then form a thin interface modification layer after further annealing operation (about 100° C.) to passivate the surface defects of perovskite and inhibit the non-radiative recombination at the interface, at the same time, some interface modifiers can also disperse the metal halide components on the surface, this interface modification layer can also effectively regulate the potential of the perovskite surface and promote the carrier transport between the perovskite layer and the hole transport layer.

However, this ex-situ method is independent of the crystallization process of perovskite, so it does not essentially improve the intrinsic growth of perovskite crystals, at the same time, the defects at the grain boundaries inside the perovskite film still make it difficult to be effectively passivated. On the other hand, the conductivity of commonly used ammonium salt interface modifiers is also generally low, which will limit the further improvement of battery device performance to a certain extent. The stability of the host-guest effect formed between the ammonium salt interface modifier and the perovskite is poor, and the problem of insufficient hydrophobicity of the salt material makes it very vulnerable to the influence of the external environment, the problem that the defect passivation effect in the device is difficult to be stable for a long time is the main reason for limiting its further application. In the preparation process of perovskite solar cell devices, the introduction of an interface modification layer will make the process more complicated, and the material cost and the processing cost of the device will also increase, which is obviously not conducive to the commercialization of perovskite solar cells.

SUMMARY

In order to solve the above technical problems, the invention proposes a method for preparing perovskite solar cells by in-situ injection of self-assembled molecules. The self-assembled conjugated molecules injected by in-situ anti-solvent can effectively passivate the defects on the surface and grain boundaries of perovskite, inhibit non-radiative recombination, and assist the growth of perovskite into larger and more uniform grains at the same time. The self-assembled conjugated molecules will also remain on the perovskite surface in large quantities, causing the surface to be reconstructed and promoting carrier transport at the perovskite/hole transport layer interface. Finally, the efficiency of perovskite solar cell devices has been significantly improved.

In order to achieve the above purpose, the invention provides a method for preparing a perovskite solar cell by in-situ injection of self-assembled molecules, including:
preparing a substrate;
preparing a perovskite precursor solution;
preparing an anti-solvent containing self-assembled conjugated small molecule materials;
dripping the perovskite precursor solution and the anti-solvent containing the self-assembled conjugated small molecule materials successively on the substrate to prepare a perovskite layer;
annealing the perovskite layer;
preparing a precursor solution of a hole transport layer;
spin-coating the precursor solution of the hole transport layer on a surface of the perovskite layer to prepare the hole transport layer;
preparing a metal electrode for the hole transport layer.

Optionally, the method for preparing the substrate is as follows:
spraying a dense titanium dioxide layer on a fluorine-doped tin oxide (FTO) conductive glass at 400-500° C. by a spray pyrolysis method, and then preparing a mesoporous titanium dioxide layer as the substrate by calcination at 500° C. for 30 min.

Optionally, the method for preparing the perovskite precursor solution is as follows:
adding 1.5-1.7 mol/L lead iodide, 0.05-0.10 mol/L cesium iodide, 0.10-0.20 mol/L methylamine hydrobromide and 1.20-1.40 mol/L formamidine hydroiodate to a mixed solvent of 800 μL N,N'-dimethylformamide and 200 μL dimethyl sulfoxide, and stirring at 75° C. for 15 min in an inert gas atmosphere until dissolved.

Optionally, the method for preparing the anti-solvent containing the self-assembled conjugated small molecule materials is as follows:

stirring and dissolving the self-assembled conjugated small molecule materials in chlorobenzene to prepare a solution of 0.1-2.0 mol/L, where the self-assembled conjugated small molecule materials are $C_{51-x}H_{72-2x-1}O_9$, $C_{52-x}H_{76-2x-1}O_8$, $C_{53-x}H_{80-2x-1}O_7$, and the x value range is 0-10.

Optionally, the method for dripping the perovskite precursor solution and the anti-solvent containing the self-assembled conjugated small molecule materials successively on the substrate to prepare the perovskite layer is as follows:

dripping the perovskite precursor on the prepared substrate, spin-coating at 5000-6000 r.p.m. to 22-26 s, and dripping 50-150 μL of anti-solvent containing self-assembled conjugated small molecule materials rapidly.

Optionally, the method for annealing the perovskite layer is as follows:

transferring the substrate coated with the perovskite layer quickly to a hot stage at 100° C. for annealing for 60 min.

Optionally, the method for preparing the precursor solution of the hole transport layer is as follows:

dissolving 70-80 mg of 2,2',7,7'-tetra [N, N-bis(4-methoxyphenyl)amino]-9,9'-spirobifluorene in 1 mL of chlorobenzene, and then doping 520 mg/mL of acetonitrile solution doped with 15-20 μL of lithium bis (trifluoromethanesulfonyl)imide in acetonitrile solution 520 mg/mL and 25-30 μL of 4-tert-butylpyridine for standby.

Optionally, the method for spin-coating the precursor solution of the hole transport layer on the surface of the perovskite layer to prepare the hole transport layer is as follows: spin-coating the precursor solution of the hole transport layer dynamically on the surface of the perovskite layer at 4000 r.p.m., and the homogenizing time is 20 s.

Optionally, the method for preparing the metal electrode on the hole transport layer is as follows: preparing a 100 nm gold electrode on the hole transport layer by a vacuum evaporation method.

The technical effect of the invention: the invention is in-situ injection of the self-assembled conjugated small molecules, which can optimize the crystallization process of perovskite from the intrinsic point of view, promote the growth of perovskite grains, reduce the grain boundaries in the film, and fundamentally reduce the probability of non-radiative recombination of carriers; the self-assembled conjugated molecules injected in situ will remain on the surface and grain boundary of perovskite, which can passivate the bulk phase and surface defects of perovskite films more comprehensively. It can disperse the lead halide components gathered on the surface in situ and retain the ability of these excess lead halides to inhibit halogen vacancy defects in perovskite. On the other hand, it can also effectively prevent the decomposition of components and improve the stability of perovskite films.

BRIEF DESCRIPTION OF THE DRAWINGS

The drawings that form part of this application are used to provide further understanding of this application, the schematic embodiments and descriptions of this application are used to explain this application and do not constitute an improper qualification of this application. In the attached figures.

DETAILED DESCRIPTION OF THE EMBODIMENTS

It should be noted that without conflict, the embodiments in this application and the characteristics of the embodiments can be combined. The following will refer to the attached diagrams and combine the embodiments to explain this application in detail.

It should be noted that the steps shown in the flow chart attached to the diagram can be executed in a computer system such as a set of computer-executable instructions, and although the logical order is shown in the flow chart, in some cases, the steps shown or described can be executed in a different order from here.

Figure 1:
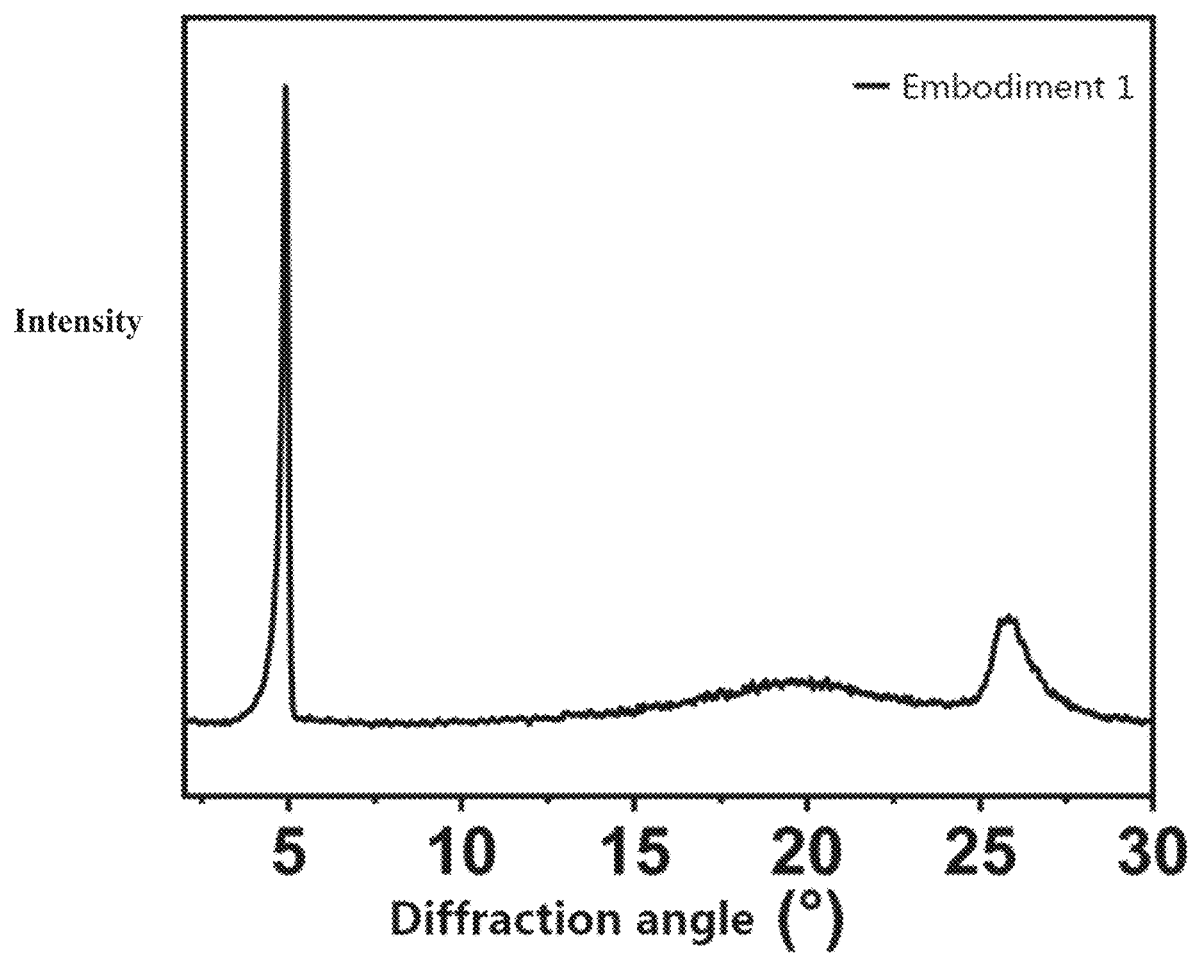
FIG. 1 is an XRD diagram obtained by observing and detecting the assembly characteristics of the self-assembled conjugated small molecules in Embodiment 1 by X-ray diffractometer in the embodiments of this invention.

As shown in FIG. 1, this embodiment provides a method for preparing a perovskite solar cell by in-situ injection of the self-assembled molecules, including preparing the substrate; preparing the perovskite precursor solution; preparing the anti-solvent containing self-assembled conjugated small molecule materials; dripping the perovskite precursor solution and the anti-solvent containing the self-assembled conjugated small molecule materials successively on the substrate to prepare the perovskite layer; annealing the perovskite layer; preparing the precursor solution of the hole transport layer; spin-coating the precursor solution of the hole transport layer on the surface of the perovskite layer to prepare the hole transport layer; preparing the metal electrode for the hole transport layer.

Specific Embodiments ($_1$) Substrate preparation: The dense titanium dioxide ($TiO_2$) layer was sprayed on the FTO conductive glass at 400-500° C. by the spray pyrolysis method, and then the mesoporous $TiO_2$ layer was prepared as the substrate by calcination at 500° C. for 30 min.

(2) Preparation of perovskite precursor solution: 1.5-1.7 mol/L lead iodide, 0.05-0.10 mol/L cesium iodide, 0.10-0.20 mol/L methylamine hydrobromide, and 1.20-1.40 mol/L formamidine hydroiodate were added to a mixed solvent of 800 μL N,N'-dimethylformamide and 200 μL dimethyl sulfoxide, and heated at 75° C. in an inert gas atmosphere for 15 min until dissolved.

(3) Preparation of anti-solvent containing self-assembled conjugated small molecule materials: The self-assembled conjugated small molecule materials $(C_{51-x}H_{72-2x-1}O_9$, $C_{52-x}H_{76-2x-1}O_8$, $C_{53-x}H_{80-2x-1}O_7)(x=0-10)$ were stirred and dissolved in chlorobenzene to prepare 0.1-2.0 mol/L solution;

(4) Preparation of perovskite layer: The perovskite precursor was dropped on the prepared substrate, when it was spin-coated at 6000 r.p.m. to 22-26 s, 50-150 μL of the anti-solvent containing self-assembled conjugated small molecule materials were dropped rapidly.

(5) Annealing: the substrate coated with the perovskite layer was quickly transferred to a hot stage at 100° C. for 60 min;

(6) Preparation of hole transport layer precursor solution: 70-80 mg of 2,2',7,7'-tetra [N, N-bis(4-methoxyphenyl)amino]-9,9'-spirobifluorene (Spiro-OMeTAD) was dissolved in 1 mL of chlorobenzene, and then the acetonitrile solution (520 mg/mL) doped with 15-20 μL of lithium bis(trifluoromethanesulfonyl)imide (Li-TFSI) and 25-30 μL of 4-tert-butylpyridine (tBP) were prepared.

(7) Preparation of hole transport layer: The precursor solution of the above hole transport layer was dynamically spin-coated on the surface of perovskite at 4000 r.p.m., and the homogenization time was 20 s;

(8) Preparation of metal electrode: A 100 nm gold electrode was prepared on the hole transport layer by vacuum evaporation.

Comparison case: The anti-solvent in the above Step (3) was changed to pure chlorobenzene, and the other steps were the same.

The solid powder X-ray diffraction (XRD) pattern of the self-assembled conjugated small molecules in Embodiment 1; the assembly characteristics of the self-assembled conjugated small molecules were observed by X-ray diffractometer, and the XRD pattern was obtained as shown in FIG. 1. As shown in FIG. 1, the diffraction peak of (100) plane is near 5°, and the diffraction peak of (001) plane is near 25-26°, which proves that the obvious columnar phase structure is formed after assembly.

Figure 2:
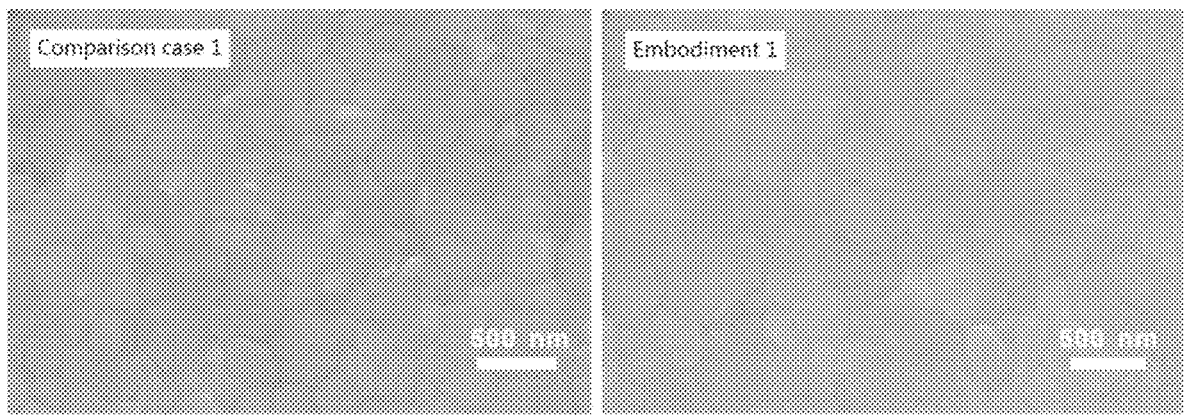
FIG. 2 is a SEM image obtained by using the field emission scanning electron microscope to observe the perovskite film processed by Comparison case 1 and Embodiment 1 in the embodiments of this invention.

Scanning electron microscope (SEM) images of perovskite films treated with Comparison case 1 and Embodiment 1; the field emission scanning electron microscope was used to observe and detect the perovskite film images processed by Comparison case 1 and Embodiment 1, and the SEM image was obtained as shown in FIG. 2. As shown in FIG. 2, the size of the perovskite crystal treated by the self-assembled conjugated small molecules in Embodiment 1 becomes significantly larger, the accumulated lead iodide on the surface disappears obviously, and the surface becomes more flat.

Figure 3:
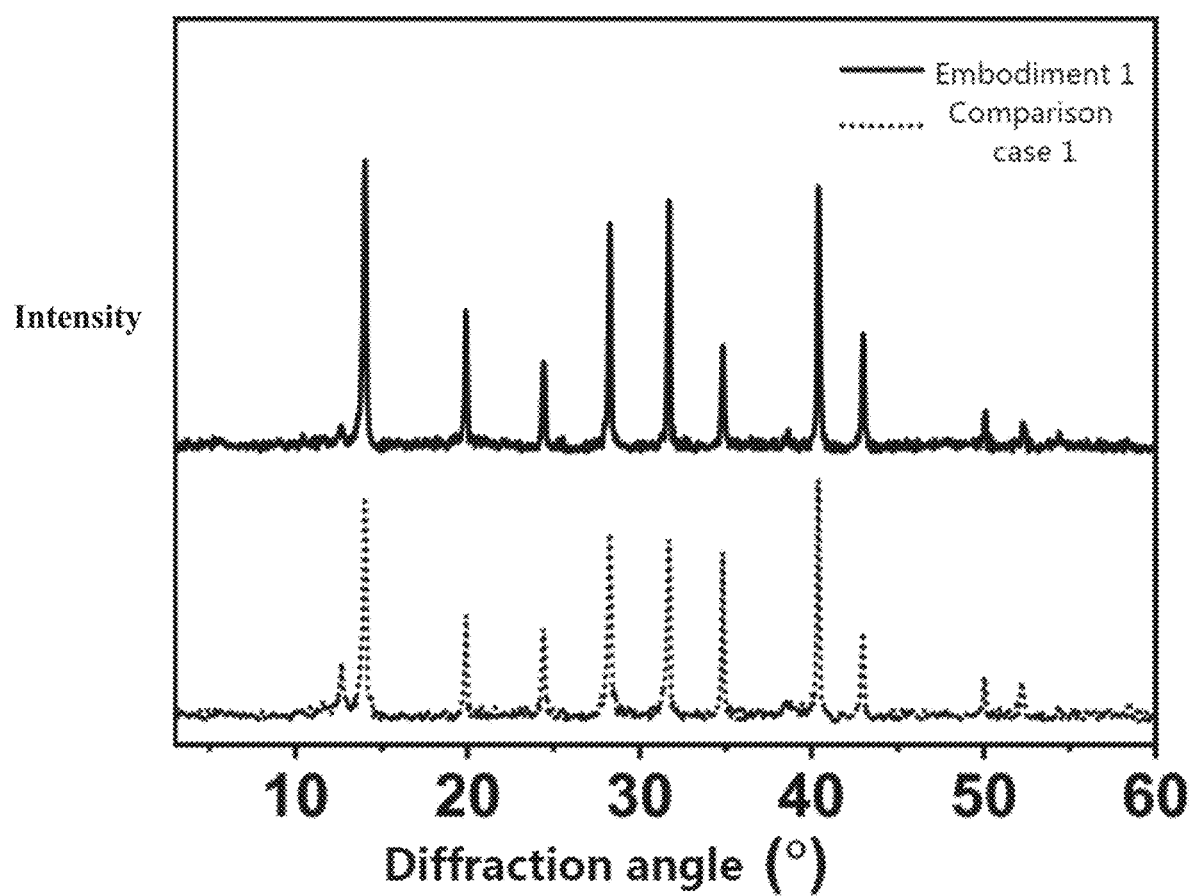
FIG. 3 is an XRD diagram obtained by using the X-ray diffractometer to observe and detect the crystallization of the perovskite film treated by Comparison case 1 and Embodiment 1 in the embodiments of this invention.

The XRD patterns of perovskite films treated with Comparison case 1 and Embodiment 1; the X-ray diffractometer was used to observe and detect the crystallization of the perovskite film treated by Comparison case 1 and Embodiment 1, and the XRD pattern was obtained as FIG. 3. As shown in FIG. 3, the diffraction peak intensity of lead iodide in perovskite treated by the self-assembled conjugated small molecules in Embodiment 1 is significantly lower than that of Comparison case 1, and the diffraction peak intensity of (100) crystal plane of perovskite is significantly higher than that of Comparison case 1, which proves that the crystallinity of perovskite treated by the self-assembled conjugated small molecules in Embodiment 1 is significantly improved, the crystal quality is significantly improved, and the aggregation of lead iodide in the film is also significantly inhibited.

Figure 4:
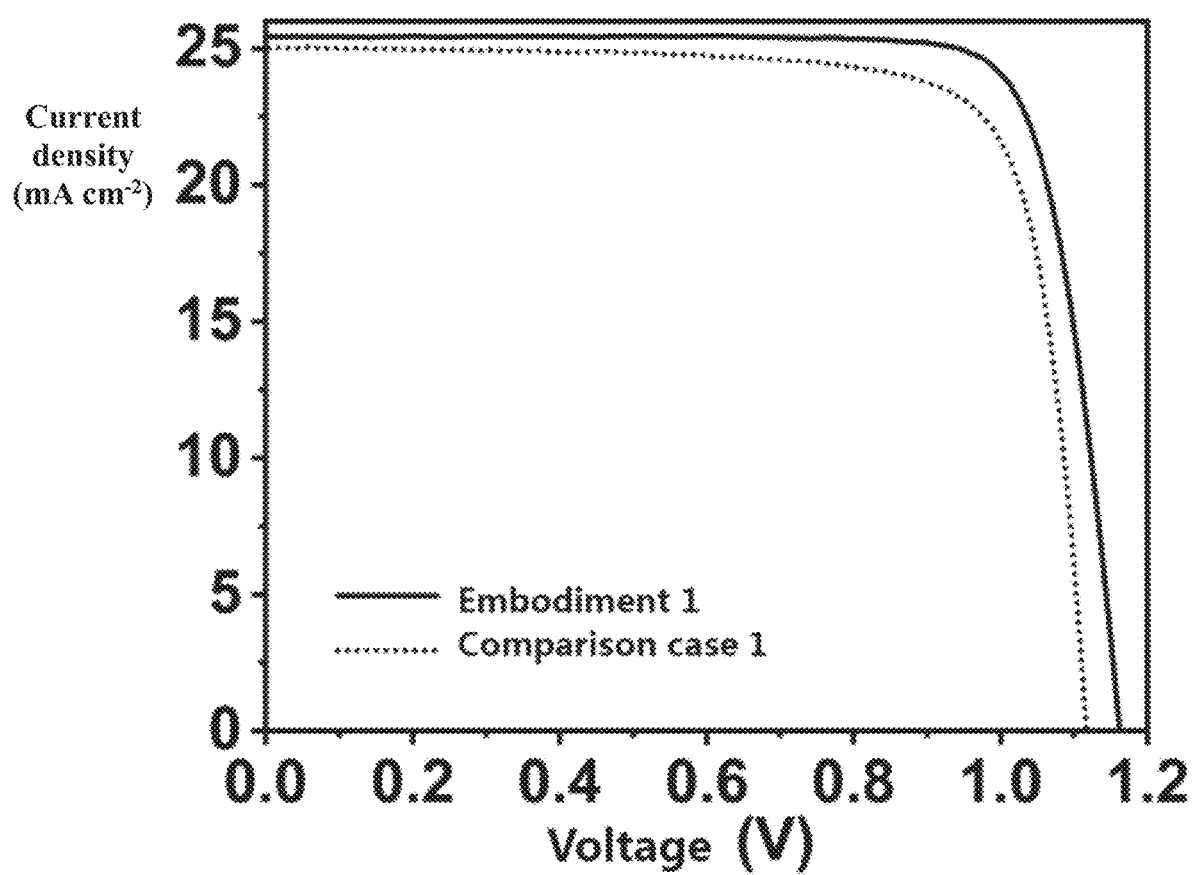
FIG. 4 is a J-V curve obtained by using the Keithley2400 source meter and the standard solar simulator (xenon lamp light source) to observe and detect the J-V curve of the perovskite solar cell constructed in Comparison case 1 and Embodiment 1 in the embodiments of this invention.

The current density-voltage (J-V) curves of perovskite solar cell devices in Comparison case 1 and Embodiment 1 under standard sunlight; the Keithley 2400 source table and the standard solar simulator (xenon lamp light source) were used to observe and detect the J-V curve of the perovskite solar cell constructed in Comparison case 1 and Embodiment 1, the obtained J-V curve is shown in FIG. 4. As shown in FIG. 4, the short-circuit current, open-circuit voltage and fill factor of the perovskite solar cell device treated by the self-assembled conjugated small molecule in Embodiment 1 are larger than those of the device in Comparison case 1, so the photoelectric conversion efficiency of the perovskite solar cell device in Embodiment 1 is larger than that of the device in Comparison case 1. It indicates that the anti-solvent injection self-assembly conjugated small molecule method can significantly improve the performance of perovskite solar cell devices.

Process: The invention retains the original device structure without adding an additional functional layer, which can effectively reduce the complexity of device preparation and save the preparation cost.

Effect: the invention is an in-situ injection of the self-assembled conjugated small molecules, which can optimize the crystallization process of perovskite from the intrinsic point of view, promote the growth of perovskite grains, reduce the grain boundaries in the film, and fundamentally reduce the probability of non-radiative recombination of carriers. The self-assembled conjugated molecules injected in situ will remain on the surface and grain boundary of perovskite, which can passivate the bulk phase and surface defects of perovskite films more comprehensively, it can disperse the lead halide components gathered on the surface in situ and retain the ability of these excess lead halides to inhibit halogen vacancy defects in perovskite, on the other hand, it can also effectively prevent the decomposition of components and improve the stability of perovskite films.

The self-assembled conjugated small molecule materials $(C_{51-x}H_{72-2x-1}O_9$, $C_{52-x}H_{76-2x-1}O_8$, $C_{53-x}H_{80-2x-1}O_7)(x=0-10)$ were stirred and dissolved in chlorobenzene to prepare 0.1-2.0 mol/L solution (doping concentration); the perovskite precursor are dropped on the prepared substrate, when it is spin-coated at 5000-6000 r.p.m. to 22-26 s, 50-150 μL of anti-solvent containing self-assembled conjugated small molecule materials is rapidly dropped (injection process).

The above content is only the better specific implementation method of this application, but the scope of protection of this application is not limited to this. Any change or replacement that can be easily imagined by technical personnel familiar with this technical field within the technical scope disclosed in this application should be covered within the scope of protection of this application. Therefore, the scope of protection of this application should be based on the scope of protection of claims.

What is claimed is:

1. A method for preparing a perovskite solar cell by an in-situ injection of self-assembled molecules, comprising:
   preparing a substrate;
   preparing a perovskite precursor solution, comprising: adding 1.5-1.7 mol/L of lead iodide, 0.05-0.10 mol/L of cesium iodide, 0.10-0.20 mol/L of methylamine hydrobromide, and 1.20-1.40 mol/L of formamidine hydroiodate to a mixed solvent of 800 μL of N,N'-dimethylformamide and 200 μL of dimethyl sulfoxide, and stirring at 75° C. for 15 min in an inert gas atmosphere until dissolved;
   preparing an anti-solvent containing self-assembled conjugated small molecule materials, comprising: stirring and dissolving the self-assembled conjugated small molecule materials in chlorobenzene to prepare a solution of 0.1-2.0 mol/L, wherein the self-assembled conjugated small molecule materials are $C_{51-x}H_{72-2x-1}O_9$, $C_{52-x}H_{76-2x-1}O_8$, $C_{53-x}H_{80-2x-1}O_7$, and an x value range is 0-10;

dripping the perovskite precursor solution and the anti-solvent containing the self-assembled conjugated small molecule materials successively on the substrate to prepare a perovskite layer, comprising: dripping the perovskite precursor solution on the substrate, spin-coating at 5000-6000 r.p.m. to 22-26 s, and dripping 50-150 μL of the anti-solvent containing the self-assembled conjugated small molecule materials rapidly;

annealing the perovskite layer, comprising: transferring a substrate coated with the perovskite layer quickly to a hot stage at 100° C. for annealing for 60 min;

preparing a precursor solution of a hole transport layer;

spin-coating the precursor solution of the hole transport layer on a surface of the perovskite layer to prepare the hole transport layer; and preparing a metal electrode for the hole transport layer.

2. The method for preparing the perovskite solar cell by the in-situ injection of the self-assembled molecules according to claim 1, wherein a method for preparing the substrate is as follows:

spraying a dense titanium dioxide layer on a fluorine-doped tin oxide (FTO) conductive glass at 400-500° C. by a spray pyrolysis method, and preparing a mesoporous titanium dioxide layer as the substrate by a calcination at 500° C. for 30 min.

3. The method for preparing the perovskite solar cell by the in-situ injection of the self-assembled molecules according to claim 1, wherein a method for preparing the precursor solution of the hole transport layer is as follows:

dissolving 70-80 mg of 2,2',7,7'-tetra [N, N-bis(4-methoxyphenyl)amino]-9,9'-spirobifluorene in 1 mL of the chlorobenzene, and doping 520 mg/mL of an acetonitrile solution doped with 15-20 μL of lithium bis(trifluoromethanesulfonyl)imide and 25-30 μL of 4-tert-butylpyridine for standby.

4. The method for preparing the perovskite solar cell by the in-situ injection of the self-assembled molecules according to claim 1, wherein a method for spin-coating the precursor solution of the hole transport layer on the surface of the perovskite layer to prepare the hole transport layer is as follows: spin-coating the precursor solution of the hole transport layer dynamically on the surface of the perovskite layer at 4000 r.p.m., and a homogenizing time is 20 s.

5. The method for preparing the perovskite solar cell by the in-situ injection of the self-assembled molecules according to claim 1, wherein a method for preparing the metal electrode on the hole transport layer is as follows: preparing a 100 nm gold electrode on the hole transport layer by a vacuum evaporation method.

\* \* \* \* \*